US009608297B2

(12) United States Patent
van Lammeren et al.

(10) Patent No.: US 9,608,297 B2
(45) Date of Patent: Mar. 28, 2017

(54) IN-CELL BATTERY MANAGEMENT DEVICE

(75) Inventors: Johannes Petrus Maria van Lammeren, Beuningen (NL); Willem Frederik Adrianus Besling, Eindhoven (NL)

(73) Assignee: DATANG NXP SEMICONDUCTORS CO., LTD., Jiangsu (CN)

( * ) Notice: Subject to any disclaimer, the term of this patent is extended or adjusted under 35 U.S.C. 154(b) by 1347 days.

(21) Appl. No.: 13/297,715

(22) Filed: Nov. 16, 2011

(65) Prior Publication Data
US 2013/0122332 A1    May 16, 2013

(51) Int. Cl.
*H01M 2/34* (2006.01)
*H01M 10/48* (2006.01)
*H01M 10/44* (2006.01)
*H01M 10/42* (2006.01)
*H04Q 9/00* (2006.01)
*H01M 2/20* (2006.01)
*G01R 31/36* (2006.01)

(52) U.S. Cl.
CPC ....... *H01M 10/4257* (2013.01); *H01M 2/345* (2013.01); *H01M 10/4207* (2013.01); *H01M 10/445* (2013.01); *H01M 10/48* (2013.01); *H04Q 9/00* (2013.01); *G01R 31/362* (2013.01); *G01R 31/3696* (2013.01); *H01M 2/202* (2013.01); *H01M 2010/4271* (2013.01); *H01M 2010/4278* (2013.01)

(58) Field of Classification Search
CPC .......... H01M 2/0267; H01M 10/425–10/4264; H01M 10/44–10/448; H01M 2010/4271–2010/4278; H01M 2/345; H01M 10/445
See application file for complete search history.

(56) References Cited

U.S. PATENT DOCUMENTS 5,619,417 A * 4/1997 Kendall ......................... 702/63
6,084,523 A * 7/2000 Gelnovatch et al. ...... 340/636.1
(Continued)

FOREIGN PATENT DOCUMENTS

CN    1865864    11/2006
CN    102239621    11/2011
(Continued)

OTHER PUBLICATIONS

Office Action from Chinese Patent Application No. 201210457718.4, mailed Jul. 31, 2014 (including English summary).
(Continued)

*Primary Examiner* — Maria J Laios
*Assistant Examiner* — Robert S Carrico
(74) *Attorney, Agent, or Firm* — Foley and Lardner LLP; Paul M. H. Pua

(57) ABSTRACT

Various embodiments relate to an in-cell battery management device including: an integrated circuit (IC) including a controller, a resistive balancer, a voltage sensor, and a pressure sensor; and an IC package that encloses the IC having a hole over the pressure sensor wherein the hole allows the pressure sensor to measure pressure in a battery cell; wherein the IC package is contact with the battery cell.

12 Claims, 4 Drawing Sheets

(56) References Cited

U.S. PATENT DOCUMENTS

| | | |
|---|---|---|
| 2006/0057458 A1* | 3/2006 | O'Dea et al. .................. 429/164 |
| 2007/0037044 A1* | 2/2007 | Sato et al. ...................... 429/96 |
| 2007/0105010 A1* | 5/2007 | Cassidy .......................... 429/90 |
| 2010/0062329 A1 | 3/2010 | Muis |
| 2013/0002260 A1 | 1/2013 | Golubkov |

FOREIGN PATENT DOCUMENTS

| | | |
|---|---|---|
| EP | 2320453 | 5/2011 |
| EP | 2357713 | 8/2011 |
| WO | WO-2009048974 | 4/2009 |
| WO | WO-2011095355 | 8/2011 |
| WO | WO-2011/117089 | 9/2011 |
| WO | WO-2011117089 | 9/2011 |

OTHER PUBLICATIONS

EESR—European Patent Office—Search Report dated Sep. 4, 2013 in a counterpart case App. No. EP 12181677.11.
Office Action for Chinese Patent Application No. 201210457718.4 mailed Apr. 9, 2014 (including English summary).

\* cited by examiner

IN-CELL BATTERY MANAGEMENT DEVICE

TECHNICAL FIELD

Various exemplary embodiments disclosed herein relate generally to in-cell battery management devices.

BACKGROUND

Current battery management systems (BMS) may consist of integrated circuits (ICs) that measure the voltage and/or temperature of a number of battery cells. The ICs also may contain circuits to perform cell balancing. Cell balancing may include changing voltage/current/charge output of the cells so that the cells equally provide energy as part of the total output of the battery. One IC may be connected to 6 or 12 battery cells. This may result in a lot of wiring in the battery pack, as each cell has to be connected to the BMS.

SUMMARY

Accordingly, there is a need for an in-cell battery management device. Such device will provide advantages over the existing battery management systems.

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may also relate to an in-cell battery management device including: an integrated circuit (IC) including a controller, a resistive balancer, a voltage sensor, and a pressure sensor; and an IC package that encloses the IC having a hole over the pressure sensor wherein the hole allows the pressure sensor to measure pressure in a battery cell; wherein the IC package is contact with the battery cell.

Various embodiments may also relate to an in-cell battery management device including: a first integrated circuit (IC) including a controller, a resistive balancer, a voltage sensor, and a wireless receiver; a second IC including a pressure sensor and a wireless transmitter; and an IC package that encloses the second IC having a hole over the pressure sensor wherein the hole allows the pressure sensor to measure pressure in a battery cell; wherein the IC package is contact with the battery cell, and wherein the second IC wirelessly transmits pressure sensor data to the first IC.

Various embodiments may also relate to a battery system including: a plurality of battery cells that each have a first power terminal and a second power terminal and a battery management integrated circuit (IC) that monitors and controls the battery cell, each said battery management IC including: a controller; a sensor coupled to the controller that measures at least one battery cell parameter; a transmitter/receiver connected to the controller that transmits battery cell data; an input port connected to the transmitter/receiver configured to connect to an output port of another battery management IC; and an output port connected to the transmitter/receiver configured to connect to an input port of another battery management ICa first connector connecting a first power terminal of a first battery cell to the second power terminal in an adjacent battery cell and a second connector connecting the second power terminal of the first battery cell to the first power terminal in another adjacent battery cell; and a third connector connecting the input port of the first battery cell to the output port of the adjacent battery cell and a fourth connector connecting the output port of the first battery cell to the input port of the other adjacent battery cell.

BRIEF DESCRIPTION OF THE DRAWINGS

In order to better understand various exemplary embodiments, reference is made to the accompanying drawings wherein.

DETAILED DESCRIPTION

Figure 1:
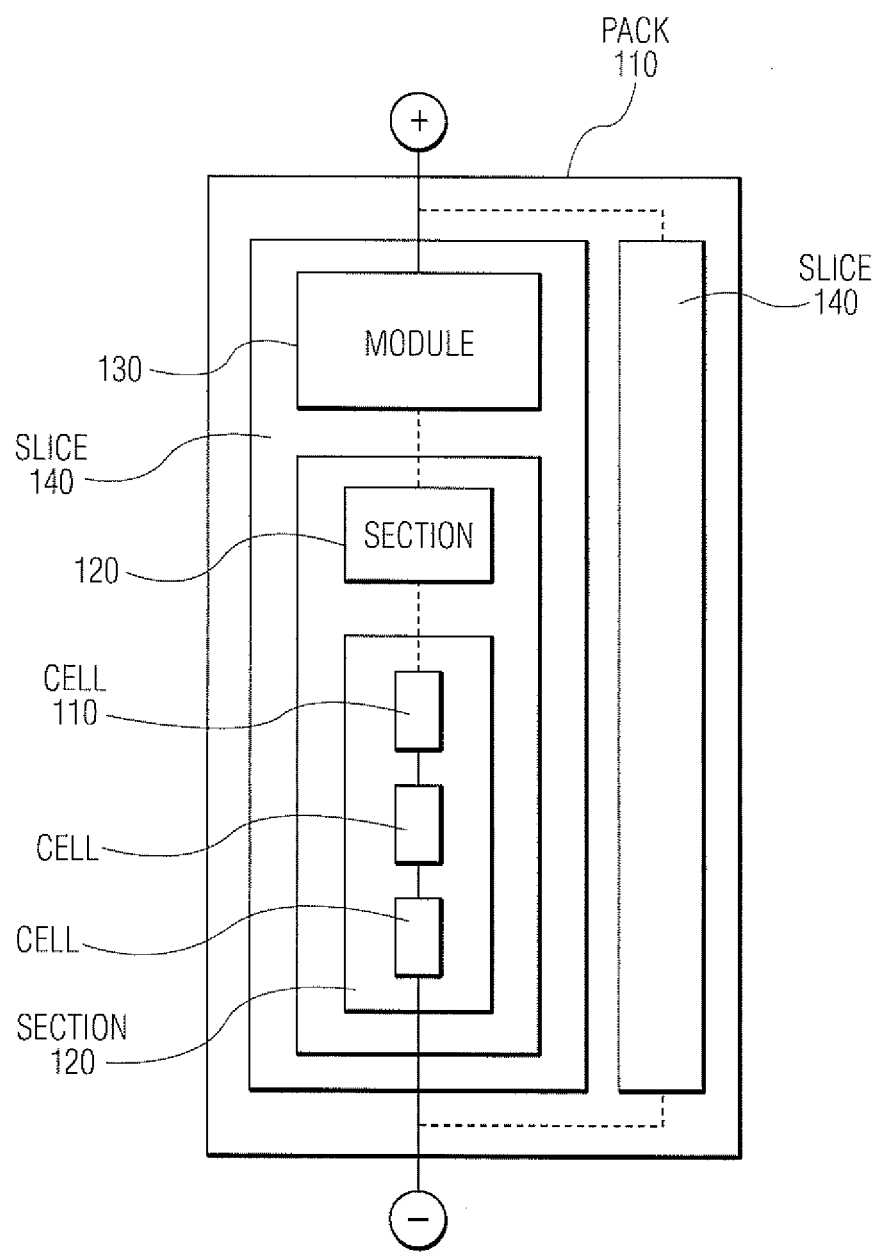
FIG. 1 is a diagram showing a nomenclature of battery components as described herein.

Referring now to the drawings, in which like numerals refer to like components or steps, there are disclosed broad aspects of various exemplary embodiments.

As battery systems become more widely used, battery management systems become more important. Battery management systems manage the overall output and performance of a battery system. The battery management system may measure a number of different parameters, for example, temperature, impedance, voltage, and cell pressure, in order to ensure the best battery performance and lifetime. Many current battery management systems do not measure the internal pressure of battery cells in the battery. Cell pressure is an important parameter that describes the state of health (SoH) of the battery cell. As a battery cell ages the internal pressure may rise. In such a case, a pouch-type battery cell may swell when internal pressure builds up. If the pressure becomes too high the pouch may rupture. As this may have a catastrophic effect on neighboring battery cells, the battery cell may have a pressure-relief valve. However, the gasses that may be released via the pressure-relief valve may be both potentially noxious and flammable. So it may be desirable to make every effort to detect the pressure build-up before battery cell venting occurs.

Presently, a common way to measure the battery cell pressure build-up is to glue a strain gauge on the cell. Alternatively, if multiple cells are held together with a band wrapped around the cells, the strain gauge is glued on that band. Although this is a simple method, it may have a disadvantage in that it may provide no indication of which cell(s) has/have problems, so if multiple battery cells suffer from pressure build-up, it is impossible to tell which ones are affected.

In the case where the battery cells are contained in a metal can or a metal cylinder, the method of using strain gauge may not be usable or accurate enough as metal cans and cylinders are very sturdy and deform only slightly under pressure. Another disadvantage of strain gauges is that they require wires to connect them to the BMS leading to a number of extra connections that increase complexity and cost of the battery system.

Accordingly, there remains a need to provide an in-cell battery management device that measures the battery cell pressure as well as providing a reduction in the number of connections in the battery management systems in order to reduce complexity and cost.

FIG. 1 is a diagram showing a nomenclature of battery components as described herein. FIG. 1 shows a simplified block diagram of a battery pack 100 with the components as described as follows. The battery cell 110 may be the basic component of the battery pack 100. The battery cell 110 may typically have a voltage of about 2.5V to about 4.2V, depending on chemistry and state of charge (SoC). A section 120 may be a group of cells that share cell-balancing and measurement components. The section 120 may typically contain up to twelve cells, depending on the measurement components. A module 130 may be a group of sections 120. The module 130 may have a voltage chosen to be a "safe voltage", for example, up to 60V. A slice 140 may be a group of series-connected modules 130 that generate the same voltage as the total battery pack 100. The slice may have a voltage that depends on the application and may be somewhere in the range of about 100V to about 600V. The battery pack 100 may include a group of parallel-connected slices 140 that make up the total battery as used in the application. The parallel connection may increase the energy content and power capabilities of the battery pack 100, but not its voltage. In many applications the battery pack 100 may consist of just one single slice 140. The battery pack 100 may have a voltage that depends on the application and may be somewhere in the range of 100V to 600V.

Figure 2:
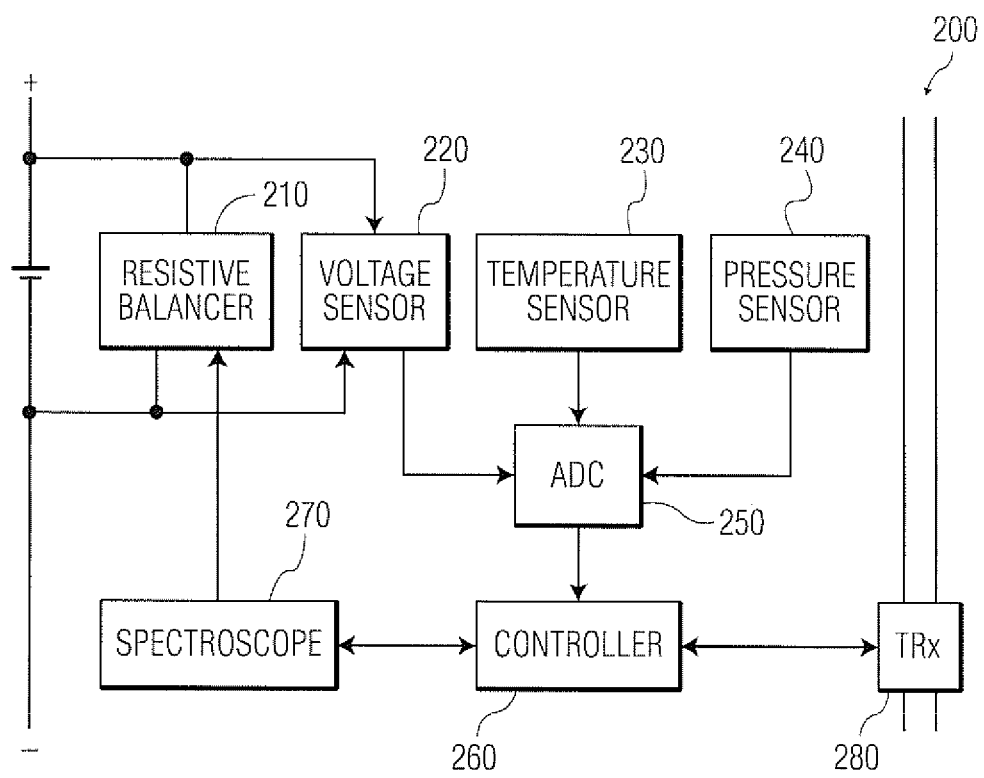
FIG. 2 illustrates a block diagram of an in-cell battery management integrated circuit.

FIG. 2 illustrates a block diagram of an in-cell battery management integrated circuit (IC) that may be built in to each individual battery cell. The battery management IC 200 may include a resistive balancer 210, a voltage sensor 220, temperature sensor 230, pressure sensor 240, an analog to digital converter (ADC) 250, a controller 260, a spectroscope 270, and a transmitter/receiver (TRx) 280. The battery management IC 200 may measure voltage, temperature and internal pressure. These measurements may be made by the voltage sensor 220, the temperature sensor 230, and the pressure sensor 240, respectively. The resistive balancer 210 may include a resistor to perform battery cell balancing. Also, the spectroscope 270 may include a circuit to modulate the balance current, so that a spectroscopic analysis of the cell impedance may be performed to characterize the impedance of the battery cell 110 as a function of frequency. The pressure sensor 240 may be for example a capacitive micromachined pressure sensor that may be integrated on top of a read-out ASIC or battery management IC 200. An advantage of using such a pressure sensor 240 may be that the capacitive read-out enables ultra-low power consumption. Due to the integration of the pressure sensor 240 on top of ASIC the parasitic losses may be reduced which is advantageous for sensitivity and signal-to-noise ratio of the pressure sensor. Moreover, the total pressure sensor size may be reduced making integration into battery management systems easier and allowing reducing manufacturing costs. The battery management IC 200 may include other sensors as well that measure other useful parameters in the battery cell.

The ADC 250 may receive analog signals from the voltage sensor 220, the temperature sensor 230, and the pressure sensor 240 and convert them into digital signals that may be provided to the controller 260. The controller 250 may receive the voltage, temperature, and pressure measurements and may use these measurements to control the battery management IC 200 as well as determine the state of health of the battery cell over time. The TRx 280 receives information from the controller that may be communicated to other battery management ICs 200 and a central battery management controller. The central battery management controller may receive input from the various battery ICs 200 and manage the overall performance of the battery pack 100.

Figure 3:
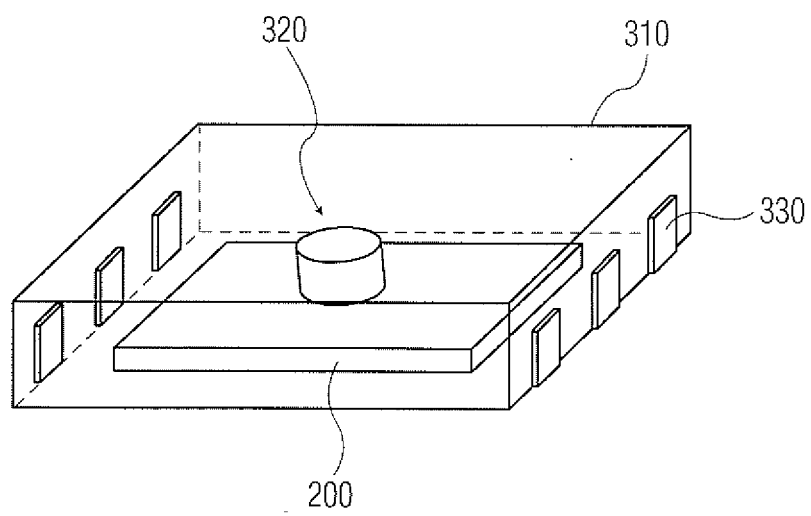
FIG. 3 illustrates an in-cell battery management IC with an access hole in the package that provides access to the pressure sensor.

FIG. 3 illustrates an in-cell battery management IC with an access hole in the package that provides access to the pressure sensor. The battery management IC 200 may be packaged in an IC package 310. The IC package 310 may have a hole 320 that allows the pressure sensor 240 to be exposed so that it may measure pressure in the battery cell 110. Pads 330 may be included on the outside of the IC package 310 that allow for an external electrical connection to the battery management IC 200. Further, the pads 330 may be integrated into the IC package 310 while having a surface exposed to allow for electrical connections to be made to the pads 330.

Figure 4:
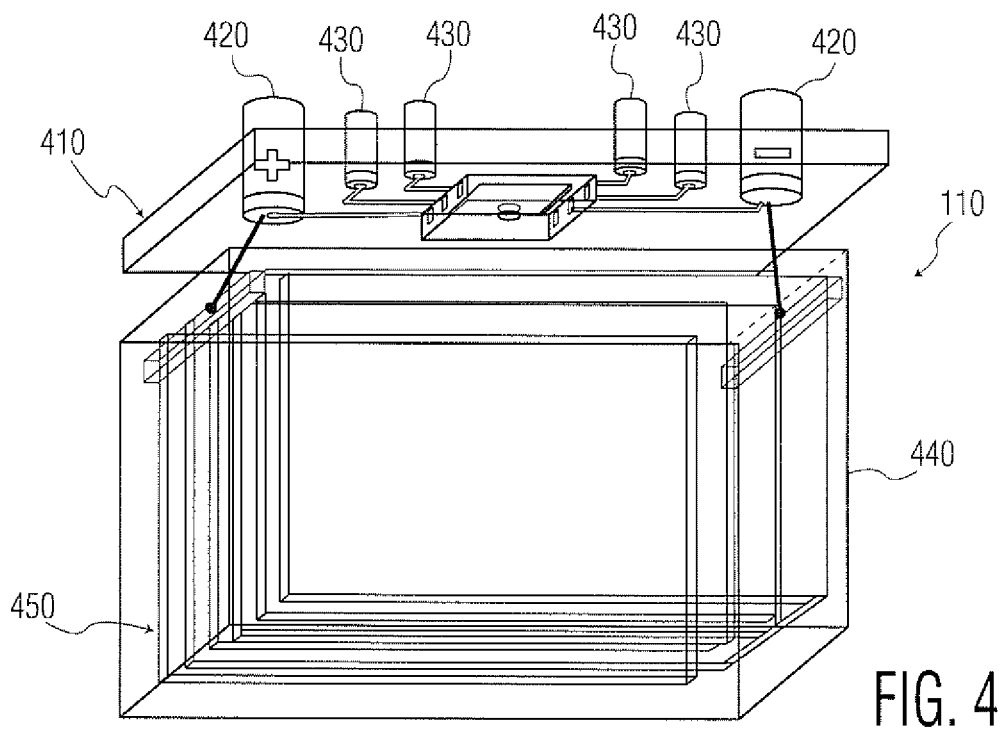
FIG. 4 illustrates an embodiment of an in-cell management device in a battery cell.

FIG. 4 illustrates an embodiment of an in-cell management device in a battery cell. FIG. 4 illustrates a possible construction of a battery cell 110 using the battery management IC 200. The battery cell 110 may include a battery management IC 200, lid 410, battery electrodes 420, TRx electrodes 430, battery cell enclosure 440, and electrode plates 450.

In a cavity on the inside of the lid 410, the battery management IC 200 may be mounted and connected to the TRx electrodes 420 and battery electrodes 430 of the battery cell 110. This type of mounting may be referred to as integrated within the lid 410. Further, when the battery management IC 200 is integrated in the lid 410, at least the hole 320 in the IC packaging 310 may be exposed to the inside of the battery cell 100. Alternatively, the battery management IC may be mounted on the lower surface of the lid 410 that faces the inside of the battery cell 110. The pads 330 that may be connected to the battery electrodes 420 and the TRx electrodes 430 and the IC package 310 may be coated with a protective material to avoid shorts and thoroughly protect against corrosion from possible harmful gases/liquids inside the battery cell 110.

The battery cell enclosure 440 may be mated with the lid 410 to create a sealed battery cell 110. The battery cell enclosure 440 may further enclose electrode plates 450 that may be connected to the battery electrodes 420.

Figure 5:
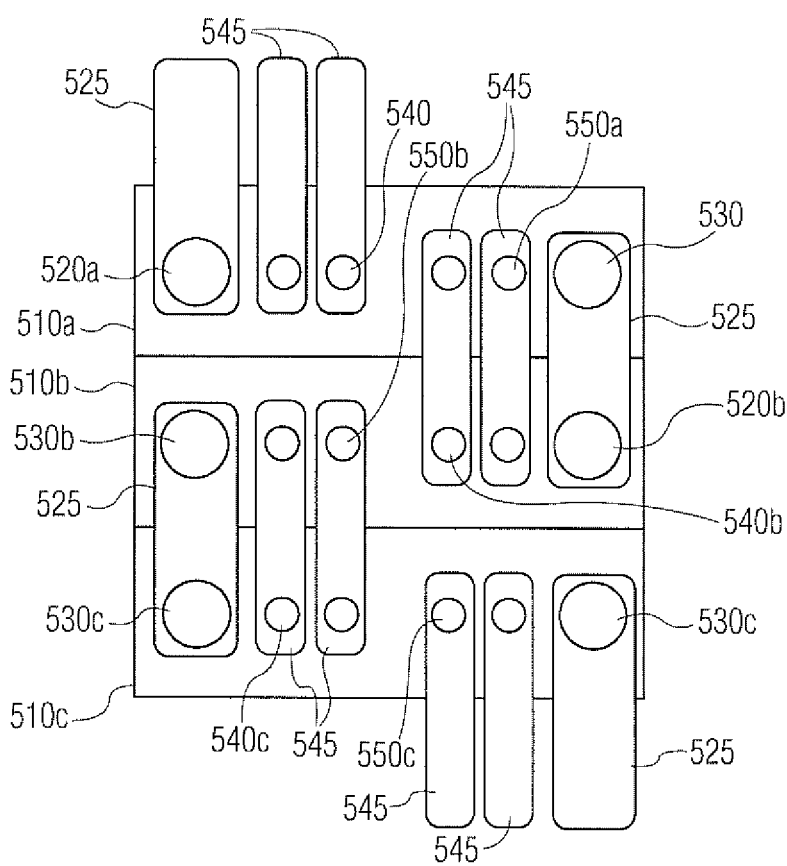
FIG. 5 is a diagram illustrating the connections between battery cells using the in-cell battery management device.

FIG. 5 is a diagram illustrating the connections between battery cells using the in-cell battery management device. FIG. 5 shows three interconnected battery cells 510a, 510b, and 510c. Each cell 510 may include a positive battery terminal 520 and a negative battery terminal 530. Further, each cell 510 may include first TRx electrodes 540 and second TRx electrodes 550. Battery electrode connectors 525 may connect the positive and negative electrodes (for example, 530a and 520b) of adjacent battery cells 510. Such a connection may allow for the battery cells 510 to be connected in series. Also, TRx electrode connectors 545 may connect first TRx electrodes and second TRx electrodes (for example 550a and 540b) of adjacent battery cells 510. Such connections may allow for the battery management ICs 200 in each battery cell 510 to be connected in series to allow for a communication path between all of the battery management ICs 200.

As FIG. 5 illustrates there may be only short straight connections between neighboring cells. This may eliminate the need for a wiring harness inside the battery pack 100.

In FIGS. 2, 4, and 5 the TRx is shown as having two connections to the cell above and two connections to the cell below. In this situation, the connections may be a differential data signal with embedded clock which may be the preferred solution. Alternatively, a single data connection may be used as single-ended clock and data lines. This would yield a battery cell 510 cell with only four electrodes, but it may require the use of a single-ended data signal with embedded clock that may be difficult to make reliable in a battery pack with very high peak currents.

Figure 6:
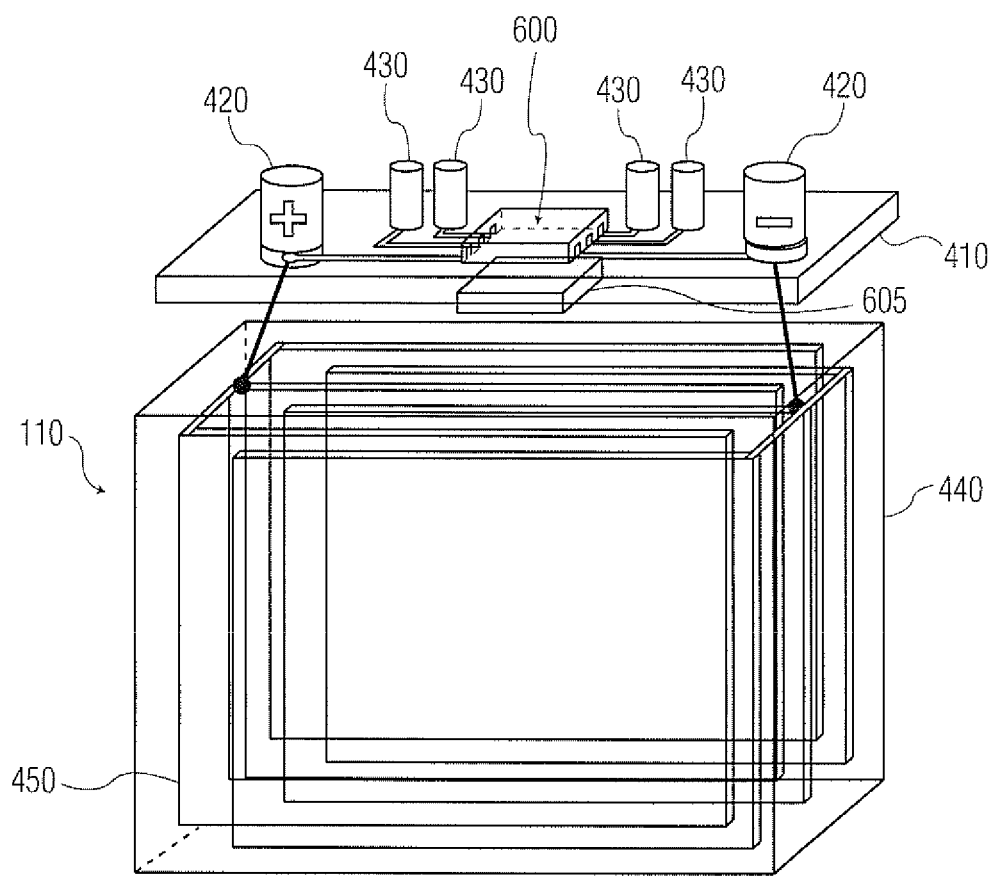
FIG. 6 illustrates another embodiment of an in-cell management device in a battery cell.
Figure 7:
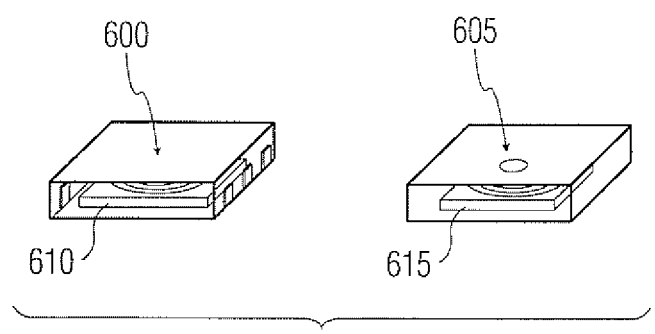
FIG. 7 illustrates another embodiment of an in-cell management device in a battery cell.

FIG. 6 illustrates another embodiment of an in-cell management device in a battery cell. The various elements in FIG. 6 are the same as those shown in FIG. 4 and have the same number labels except for the battery management IC 605. FIG. 6 illustrates a battery management IC 600 and a pressure sensor IC 605. FIG. 7 illustrates this other embodiment of an in-cell management device. The battery management IC 600 measures all battery functions such as voltage, impedance, and temperature and performs resistive cell balancing as before. In this embodiment, the pressure sensor IC 605 may measure the battery cell pressure and wirelessly transmit pressure data to the battery management IC 600. Accordingly, the pressure sensor IC 605 may be exposed to the inside of the battery cell and wirelessly coupled to the battery management IC 600 on the outside. This wireless coupling may be accomplished using induction as well as other wireless techniques. The pressure sensor IC 605 may include a coil 615 and may be placed on the opposite side of the lid 410 from the battery measurement IC 600 that may include a second coil 610 that may be in the battery management IC 600. The resonant frequency of a LC tank formed by the two coils 610 and 615 and the capacitive pressure sensor may be a function of the internal pressure due to the variable distance between the capacitor plates in the pressure sensitive membrane. An advantage of this embodiment may be that fewer connections through the lid 410 may be required and that there may be no external pins for the pressure sensor IC 605. Further, as described above with respect to battery management IC 200, the pressure sensor management IC 605 may be mounted on the underside of the lid 410 or mounted integral to the lid 410. Also, the pressure sensor IC 605 may be coated with a protective material to avoid shorts and thoroughly protect against corrosion from possible harmful gases/liquids inside the battery cell 110.

In the embodiments described above, data logging and pressure trend monitoring in ultra-low power consumption ICs may allow for battery life monitoring and the optimal moment for battery pack replacement before the battery degrades catastrophically. Further, if a sudden pressure or temperature increase is detected and exceeds a predefined pressure or temperature threshold, the battery management system may switch off one of the battery cells/battery sections when too high a pressure may be reached either during charging or discharging to protect the cells/sections against damage.

The embodiments described above provide a variety of advantages. First, one battery management IC measures all important parameters of the cell: voltage, temperature, impedance, and pressure. Second, increased accuracy of the State of Health estimation may be provided, as a slow pressure build up indicates the decay of the chemical components of the battery cells. Third, increased safety may be provided, as a sudden rise in pressure indicates problems that require shutdown of the battery pack. Fourth, battery management IC may also perform resistive cell balancing. Fifth, the battery pack may include identical six-pin (or four-pin) battery cells in order to decrease the complexity and number of connections in the battery pack. Sixth, only straight connections between neighboring cells may be used in the battery pack. Seventh, a wiring harness inside the battery modules/pack may be eliminated. Eighth, the printed circuit boards inside each module of the battery pack may be greatly simplified as they now only contain the interface to the pack controller. Ninth, the embodiments described may reduce the risk of short circuits that would damage the electronics due to incorrect connection of the pins of the cells during construction of the battery pack.

It should be appreciated by those skilled in the art that any block diagrams herein represent conceptual views of illustrative circuitry embodying the principles of the invention. Similarly, it will be appreciated that any state transition diagrams, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. An in-cell battery management device comprising:
   an integrated circuit (IC) including a controller, a resistive balancer, a voltage sensor, and a pressure sensor, wherein the pressure sensor is integrated as a top portion of the IC; and
   an IC package that encloses the IC having a hole over the pressure sensor wherein the hole exposes the pressure sensor to an inside of a battery cell and allows the pressure sensor to measure pressure within the battery cell, the IC package mounted to a top portion of the battery cell, the top portion having battery electrodes of the battery cell;
   wherein the IC package is in contact with the battery cell.

2. The device of claim 1, wherein the IC includes at least one of a temperature sensor and an impedance spectroscope.

3. The device of claim 2, wherein the controller analyzes temperature, voltage, and pressure measurement data to determine the state of health of the battery cell.

4. The device of claim 2, wherein the controller logs measurement data and monitors battery cell performance trends based upon the logged measurement data.

5. The device of claim 1, wherein the IC further comprises:
   a transmitter/receiver connected to the controller that transmits battery cell data;
   an input port connected to the transmitter/receiver configured to connect to an output port of another in-cell battery management device; and
   an output port connected to the transmitter/receiver configured to connect to an input port of another in-cell battery management device.

6. The device of claim 5, wherein the input and output ports each include two terminals to provide a differential output signal.

7. The device of claim 5, wherein the input and output ports each include only a single terminal.

8. The device of claim 1, further comprising a protective coating over the IC package and an exposed portion of the pressure sensor that protects against the battery cell environment.

9. The device of claim 1, wherein the controller switches off the battery cell based upon a monitored trend.

10. The device of claim 1, wherein the top portion of the battery cell comprises a lid, the IC is mounted on the lid of the battery cell or integral to the lid of the battery cell.

11. The device of claim 1, wherein the pressure sensor is integral with a readout circuit.

12. The device of claim 1, wherein the pressure sensor is wirelessly coupled to the IC.

* * * * *